United States Patent
Bhatia et al.

(10) Patent No.: US 7,737,052 B2
(45) Date of Patent: Jun. 15, 2010

(54) ADVANCED MULTILAYER DIELECTRIC CAP WITH IMPROVED MECHANICAL AND ELECTRICAL PROPERTIES

(75) Inventors: Ritwik Bhatia, Albany, NY (US); Griselda Bonilla, Fishkill, NY (US); Alfred Grill, White Plains, NY (US); Joshua L. Herman, Troy, NY (US); Son Van Nguyen, Schenectady, NY (US); E. Todd Ryan, Clifton Park, NY (US); Hosadurga Shobha, Niskayuna, NY (US)

(73) Assignees: International Business Machines Corporation, Armonk, NY (US); Advanced Micro Devices, Inc., Austin, TX (US); Applied Materials, Inc., Santa Clara, CA (US)

( * ) Notice: Subject to any disclaimer, the term of this patent is extended or adjusted under 35 U.S.C. 154(b) by 211 days.

(21) Appl. No.: 12/042,873

(22) Filed: Mar. 5, 2008

(65) Prior Publication Data

US 2009/0224374 A1 Sep. 10, 2009

(51) Int. Cl.
*H01L 21/31* (2006.01)
*H01L 21/469* (2006.01)
*H01L 23/58* (2006.01)
*H01L 23/48* (2006.01)

(52) U.S. Cl. .................. 438/787; 257/635; 257/758; 257/E21.277; 257/E21.576; 257/E23.161

(58) Field of Classification Search ............... 438/758, 438/787; 257/750, 751, 704, 758, 635, E21.277, 257/E21.24, E21.576, E23.161
See application file for complete search history.

(56) References Cited

U.S. PATENT DOCUMENTS

| | | | |
|---|---|---|---|
| 7,091,137 B2 | 8/2006 | Lee et al. | |
| 7,138,717 B2 | 11/2006 | Wang et al. | |
| 7,151,315 B2 | 12/2006 | Wu et al. | |
| 7,189,658 B2 | 3/2007 | Lakshmanan et al. | |
| 7,514,317 B2 * | 4/2009 | Lindsay | ............ 438/248 |

OTHER PUBLICATIONS

U.S. Appl. No. 10/047,968, entitled "Integration scheme for advanced BEOL metallization including low-k cap layer and method thereof," First Named Inventor: Stephen Gates, filed on Jan. 15, 2002.

* cited by examiner

*Primary Examiner*—David S Blum
(74) *Attorney, Agent, or Firm*—Scully, Scott, Murphy & Presser, P.C.; Louis J. Percello, Esq.

(57) ABSTRACT

A dielectric cap, interconnect structure containing the same and related methods are disclosed. The inventive dielectric cap includes a multilayered dielectric material stack wherein at least one layer of the stack has good oxidation resistance, Cu diffusion and/or substantially higher mechanical stability during a post-deposition curing treatment, and including Si—N bonds at the interface of a conductive material such as, for example, Cu. The dielectric cap exhibits a high compressive stress and high modulus and is still remain compressive stress under post-deposition curing treatments for, for example: copper low k back-end-of-line (BEOL) nanoelectronic devices, leading to less film and device cracking and improved reliability.

10 Claims, 1 Drawing Sheet

ADVANCED MULTILAYER DIELECTRIC CAP WITH IMPROVED MECHANICAL AND ELECTRICAL PROPERTIES

FIELD OF THE INVENTION

The present invention relates generally to integrated circuit (IC) chip fabrication, and more particularly, to a dielectric cap for an advanced interconnect structure, such as, for example, a copper-containing ultra-low dielectric constant dielectric interconnect structure.

BACKGROUND OF THE INVENTION

In traditional IC chips, aluminum, Al, and aluminum alloys have been used as interconnect metallurgies for providing electrical connections to and from devices in semiconductor interconnect (i.e., back-end-of-the-line, BEOL) layers of the devices. While Al-based metallurgies have been the material of choice for use as metal interconnects in the past, Al-based metallurgies no longer satisfy requirements as circuit density and speeds for IC chips increase and the scale of the devices decreases to nanometer dimensions. Thus, copper, Cu, and Cu-alloys are being employed as a replacement for Al-based metallurgies in nano-electronic devices because of their lower resistivity and their lower susceptibility to electromigration failure as compared to Al-based metallurgy.

One challenge relative to using Cu-based (i.e., pure Cu and Cu alloys) metallurgy is that it diffuses readily into the surrounding interconnect dielectric material as BEOL processing steps continue. To inhibit copper diffusion, copper-based interconnects can be isolated by employing protective barrier layers. Such protective barrier layers include, for example, conductive diffusion barrier liners of tantalum, titanium or tungsten, in pure, alloy and/or nitrided form, along the sidewalls and bottom of the copper-based interconnection. On the top surface of the copper-based interconnects, capping barriers are provided. In the prior art, such capping barrier layers comprise various dielectric materials, e.g., silicon nitride ($Si_3N_4$).

A conventional interconnect structure utilizing copper-based metallization and cap layers described above includes a lower substrate which may contain logic circuit elements such as, for example, transistors. An interlevel dielectric (ILD) layer is located above the substrate. The ILD layer may be formed of, for example, silicon dioxide ($SiO_2$). However, in advanced interconnects, the ILD layer is preferably a low dielectric constant k material such as, for example, plasma deposited SiCOH or porous SiCOH. An adhesion promoter layer may be disposed between the substrate and the ILD layer. A silicon nitride ($Si_3N_4$) or SiCN (N-Blok) layer is optionally disposed on the ILD layer. The silicon nitride or silicon carbon nitride (N-Blok) layer is commonly known as a hard mask layer or polish stop layer. At least one conductor is embedded in the ILD layer. The conductor is typically copper or a copper alloy in advanced interconnects, but alternatively may be aluminum or another conductive material. When the conductor is copper-based, a diffusion barrier liner is preferably disposed between the ILD layer and the copper-based conductor. The diffusion barrier liner is typically comprised of tantalum, titanium, tungsten, or nitrides of these metals.

The top surface of the conductor is made coplanar with the top surface of the hard mask layer usually by a chemical-mechanical polish (CMP) step. A cap layer, also typically of silicon nitride or N-Blok, is disposed on the conductor and the hard mask layer. The cap layer acts as a diffusion barrier to prevent diffusion of copper from the conductor into the surrounding dielectric material during subsequent BEOL processing steps.

Plasma enhanced chemical vapor deposition (PECVD) films such as N-Blok or silicon nitride provide superior electromigration protection, and help to curtail diffusion of copper atoms along the interconnect surface.

Recently, the use of ultra low dielectric constant (ULK) dielectric materials (i.e. k<3.0) for copper-based interconnects have turned to ultra low k, two phase porous SiCOH. These dielectric materials require the use of a post-deposition curing step using ultraviolet (UV) and/or electron beam (E-Beam) radiation, for example. The energy used during post-deposition curing such as, for example, UV radiation, changes the cap film's stress to a more tensile direction. Typically, the energy of the curing process such as, for example, UV exposure, changes the stress of the cap layer from compressive to tensile which could potentially result in cracking and adhesion problems in both the cap layer and the ULK dielectric material. Any crack in the cap layer may lead to copper diffusion into the interconnect dielectric material layer, i.e., ILD, through the seam leading to formation of a copper nodule under the cap layer. The presence of such a copper nodule in the ILD may lead to short circuits due to leakage of current between adjacent interconnect lines.

The change from the cap film's compressive to tensile stress during the post-deposition curing treatment process will create intrinsic mechanically instability between the metal-cap-dielectric films and may also cause other damages such as, for example, increased cap-interlevel dielectric film cracking, delamination and blister formation over patterned copper lines, particularly during subsequent dielectric depositions, metallization, and chemical-mechanical polishing. Therefore, the retention of high compressive cap film's stress during post-deposition treatment is highly desirable for stable BEOL Cu-cap-low k ILD structures.

Furthermore, the need for reducing capacitance in advanced nano-electronic devices also requires that the overall dielectric constant of the cap film must be lower than silicon nitride (k~7.0), silicon carbide (SiCH) and silicon carbon nitride (SiCNH, k~5.5) cap films which are currently being employed in advanced interconnect structures.

In view of the foregoing, there is a need for a dielectric cap having a lower dielectric constant and higher mechanical and electrical stability to post-deposition curing treatment (e.g., UV and/or B-beam) than presently used dielectric cap materials.

SUMMARY OF THE INVENTION

The present application relates to a dielectric cap, an interconnect structure including the inventive dielectric cap located above an interconnect dielectric having at least one conductive material embedded therein and related methods of forming the dielectric cap and the interconnect structure.

Specifically, the invention provides a dielectric cap for use in an advanced interconnect structure which overcomes the drawbacks mentioned with prior art dielectric cap layers. In particular, the present invention provides a dielectric cap that has a lower dielectric constant and higher mechanical and electrical stability to post-deposition curing treatment energies (such as UV and/or E-Beam radiation) than presently employed dielectric cap materials.

More particularly, the present invention provides a dielectric cap including multilayers of dielectric materials, wherein at least one of the multilayers provides good oxidation resistance, inhibits Cu diffusion and/or provides substantially high mechanical stability for the multilayer cap-interlevel dielectric structures by maintaining the compressive stress value under UV and/or E-beam radiation during a post-deposition curing process.

Even more particularly, the present invention provides a dielectric cap including a multilayered dielectric material stack, wherein at least one layer of the multilayered dielectric material stack includes Si—N bonding in which the nitrogen atoms of such Si—N bonding has free electrons that have a high affinity for bonding with a conductive material such as, for example, Cu. In a preferred embodiment of the present invention, the at least one layer of the inventive multilayered dielectric material stack including said Si—N bonding is present at the interface with a conductive material embedded within an interconnect (i.e., interlevel) dielectric material.

The inventive dielectric cap exhibits a high compressive stress (equal to, or greater than, 150 MPa as-deposited) and high modulus (on the order of 20 GPa or greater) and maintains the compressive stress and modulus values after a post-deposition curing treatment process. When the inventive dielectric cap is used in an advanced interconnect structure, such as for example, a Cu-containing low k BEOL nanoelectric structure, little or no film and device cracking is observed as compared to an interconnect structure including a conventional dielectric cap. Moreover, the use of the inventive dielectric cap in an advanced interconnect structure improves the reliability of the interconnect structure as compared to a prior art interconnect structure including a conventional dielectric cap.

In a first aspect of the present invention, and as generally discussed above, the present invention provides a dielectric cap for use in advanced interconnect structures which comprises:

a multilayered dielectric material stack having an effective dielectric constant of equal to, or less than, 4.5 and a compressive stress of equal to, or greater than, 100 MPa which remains compressively stressed even after post-deposition curing, wherein at least one layer of said multilayered dielectric stack includes Si—N bonding.

This dense Si—N bonding will be a good oxidation and Cu diffusion barrier. The Si—N bonding of the inventive dielectric cap has N atoms that have free electrons associated therewith. The free electrons have a high affinity for bonding Cu atoms.

The at least one layer having the Si—N bonding mentioned above has a nitrogen content that is greater than about 15 atomic %, with a nitrogen content from 17 to about 25 atomic % being even more preferred.

In one embodiment of the first aspect of the present invention, the dielectric cap is a cured material which maintains compressively stressed even after a post-deposition curing step. In some embodiments of the present invention, the cured dielectric cap has a compressive stress that is equal to, or greater than, 150 MPa.

In another embodiment of the first aspect of the present invention, the Si—N bonding within the inventive dielectric cap is of a sufficient content to provide a high optical band gap (on the order of about 3.0 eV (electron-volts) or greater) layer which substantially blocks UV radiation during a post-deposition UV curing process. By "sufficient content" it is meant that the Si—N bonding is present within at least one layer of the inventive dielectric cap in an amount from about 15 to about 40 atomic %, with an amount from about 17 to about 30 atomic % being even more preferred.

In a still further embodiment of the first aspect of the present invention, the inventive dielectric cap further includes another layer which includes atoms of at least Si and C, optionally O, wherein the C atoms are present in an amount of about 15 atomic % or greater, preferably from about 20 to about 35 atomic %, to provide a layer within the multilayered dielectric material stack that improves the etch selectivity of the dielectric cap to the interlevel or intralevel dielectric.

In a yet further embodiment of the first aspect of the present invention, the inventive dielectric layer includes at least a lower layer having the Si—N bonding mentioned above, and optionally at least one overlying layer that includes atoms of at least Si and C, optionally O, wherein the C atoms are present in an amount of about 15 atomic % of greater.

In a yet still further embodiment of the present invention, the inventive dielectric cap includes an additional oxygen diffusion barrier overlaying a lower layer having the Si—N bonding mentioned above. The additional oxygen diffusion barrier can be formed, in some instances, by contacting the lower layer having the Si—N bonding with oxygen at an elevated temperature (greater than about 120° C.). In this embodiment, the layer including the Si—N bonding has a bonding matrix of Si—N, N—Si—C, or Si—N—C. When exposed to oxygen, the layer including one of the aforementioned bonding matrix forms an oxygen diffusion barrier overlayer that has one of the following bonding matrixes, Si—N—O, N—Si—C—O or O—Si—N—C.

In a second aspect of the present invention, an interconnect structure is provided that comprises:

at least one interlevel or intralevel dielectric material having an embedded conductive material located therein, said embedded conductive material having an upper surface that is substantially coplanar with an upper surface of said at least one interlevel or intralevel dielectric material; and a dielectric cap located on at least said upper surface of said embedded conductive material, said dielectric cap comprising a multilayered dielectric material stack having an effective dielectric constant of equal to, or less than, 4.5 and a compressive stress of equal to, or greater than, 100 MPa which remains compressively stressed even after a post-deposition curing process, wherein at least one layer of said multilayered dielectric stack includes Si—N bonding.

The at least one layer having the Si—N bonding mentioned above has a nitrogen content that is greater than about 15 atomic %, with a nitrogen content from 17 to about 25 atomic % being even more preferred.

In one embodiment of the second aspect of the present invention, the dielectric cap is a cured material which maintains a compressive stress as mentioned above. In some embodiments of the present invention, the cured dielectric cap has a compressive stress that is equal to, or greater than, 150 MPa.

In another embodiment of the second aspect of the present invention, the Si—N bonding within the inventive dielectric cap is of a sufficient content to provide a dielectric cap with high optical band gap (on the order of about 3.0 EV (electron-volts) or greater) layer which substantially blocks UV radiation during a post deposition UV curing process. This will minimize the impact of UV cure in the bottom layer of the multilayer structure and reduce the change in the film's stress by post UV cure.

In a further embodiment of the second aspect of the present invention, another layer is present which includes atoms of at least Si and C wherein said C atoms are present in an amount of about 15 atomic % or greater so as to provide a layer within the mutilayered dielectric material stack that improves the etch selectivity of the dielectric cap to the interlevel or intralevel dielectric.

In another embodiment of the second aspect of the present invention, the embedded conductive material comprises Cu, a Cu alloy, Al or an Al alloy, with Cu and a Cu alloy being preferred.

In still another embodiment of the second aspect of the present invention, a diffusion barrier is located between the embedded conductive material and the interlevel or intralevel dielectric material.

In a yet further embodiment of the second aspect of the present invention, the inventive dielectric layer includes at least a lower layer having the Si—N bonding mentioned above, and optionally at least one overlying layer that includes atoms of at least Si and C, optionally O, wherein the C atoms are present in an amount of about 15 atomic % or greater.

A yet still further embodiment of the present invention, the inventive dielectric cap includes an oxygen diffusion barrier overlayer located atop a lower layer having the Si—N bonding mentioned above. This will act as an additional oxidation barrier and specific plasma etch selectivity where etching chemistry is more selective to Si—N bonding. In some embodiments, the oxygen diffusion barrier overlayer is formed by contacting the lower layer having the Si—N bonding with oxygen at an elevated temperature (greater than about 120° C.). In this embodiment, the layer including the Si—N bonding has a bonding matrix of Si—N, N—Si—C, or Si—N—C. When exposed to oxygen, the layer including one of the aforementioned bonding matrix forms an oxygen diffusion barrier surface layer that has one of the following bonding matrixes Si—N—O, N—Si—C—O or O—Si—N—C. Basically, the bottom oxidation barrier properties of the bottom layer can be improved by a brief oxidation to form an intermediate oxygen bearing interface prior to the deposition of higher carbon contained low-k top layer of the dielectric cap.

In a third aspect of the present invention, a method of forming the inventive dielectric cap is provided. The method of forming the inventive dielectric cap, which can be easily integrated into a conventional interconnect process flow, comprises:

providing a reactor chamber including a substrate positioned therein;

introducing at least a silicon or silicon and carbon-based precursor and a nitrogen-containing precursor into said reactor chamber; and depositing a dielectric cap on a surface of said substrate from said silicon-based precursor and said nitrogen-containing precursor, wherein said dielectric cap comprises a multi-layered dielectric material stack having an effective dielectric constant of equal to, or less than, 4.5 and a compressive stress of equal to, or greater than, 100 MPa, wherein at least one layer of said multilayered dielectric stack includes Si—N bonding.

In some embodiments of the present invention, the inventive method for forming the dielectric cap further includes a post-depositing curing process. The post-deposition curing process may include exposure to heat, UV radiation, E-beam radiation or combinations thereof It is noted that in the third aspect of the present invention, the dielectric material that is formed has any of the embodiments mentioned above in respect to the first and second aspects of the invention.

In a fourth aspect of the present invention, a method of forming an interconnect structure is provided that includes the inventive dielectric cap located on a surface of at least an embedded conductive material which is present within an interlevel or intralevel dielectric material. This aspect of the present invention comprises:

providing a structure including at least one interlevel or intralevel dielectric material having an embedded conductive material located therein, said embedded conductive material having an upper surface that is substantially coplanar with an upper surface of said at least one interlevel or intralevel dielectric material; and forming a dielectric cap located on at least said upper surface of said embedded conductive material, said dielectric cap comprising a multilayered dielectric material stack having an effective dielectric constant of equal to, or less than, 4.5 and a compressive stress of equal to, or greater than, 100 MPa which still remains compressively stressed even after a post-deposition curing process, wherein at least one layer of said multilayered dielectric stack includes Si—N bonding near the interface of the conductive material.

The forming of the dielectric cap includes introducing at least a silicon-based precursor and a nitrogen-containing precursor into a reactor chamber including said structure and depositing said dielectric cap on at least the upper surface of said embedded conductive material from said silicon-based precursor and said nitrogen-containing precursor. A post-deposition curing step (i.e., exposure to heat, UV exposure, E-beam exposure or combinations thereof) typically follows the deposition of the dielectric cap.

It is noted that in the fourth aspect of the present invention, the dielectric material that is formed has any of the embodiments mentioned above in respect to the first and second aspects of the invention.

DETAILED DESCRIPTION OF THE INVENTION

The present invention, which provides a dielectric cap, an interconnect structure including the inventive dielectric cap located above an interlevel or intralevel dielectric having at least one conductive material embedded therein and related methods of forming the dielectric cap and the interconnect structure, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
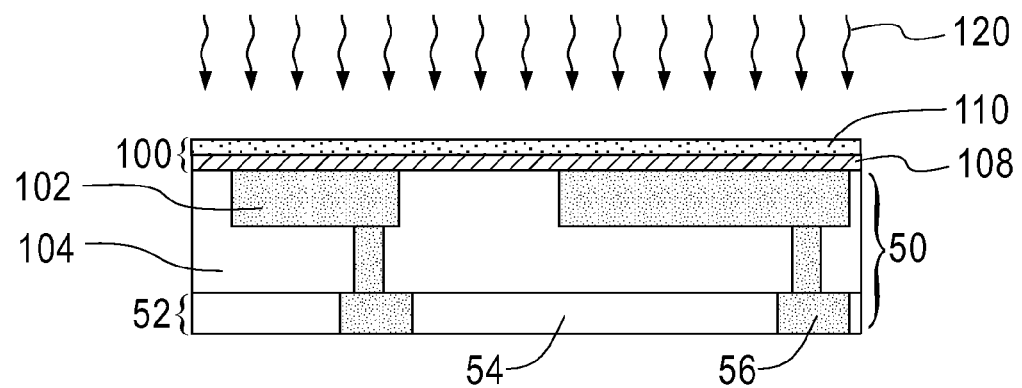
FIG. 1 is a pictorial representation (through a cross sectional view) depicting an interconnect structure including the inventive dielectric cap located on an exposed surface of an interlevel or intralevel dielectric having at least one conductive material embedded therein.

Reference is first made to FIG. 1 which illustrates a typically semiconductor structure, i.e., an interconnect structure, in which the inventive dielectric cap can be used. Although illustration is made to the specific interconnect structure shown in FIG. 1, the present invention is not limited to using the inventive dielectric cap in the specific interconnect structure shown. Instead, the inventive dielectric cap can be used in numerous interconnect structures, as well as other semiconductor structures in which a dielectric cap is located atop a surface of a dielectric material having a conductive material embedded therein. Typically, the inventive dielectric cap is used in interconnect structures in ultra-large scale integrated (ULSI) nano and microelectronic integrated circuit (IC) chips including, for example, high speed microprocessors, application specific integrated circuits, memory storage devices, and related electronic structures with a multilayered barrier layer.

Reference is first made to FIG. 1 which is a cross sectional view of an interconnect structure 50 including the inventive dielectric cap 100 located on an interlevel or interlevel dielectric (ILD) 104 including conductive material 102 (which is represented as a combination of via and line patterns) embedded within the ILD 104.

The interconnect structure 50 is typically located upon a substrate 52. The substrate 52 may comprise a semiconducting material, an insulating material, a conductive material or any combination including multilayers thereof. In FIG. 1, and by way of an example, substrate 52 is shown as a lower interconnect level including an interconnect dielectric 54 and a conductive material 56 embedded therein.

When the substrate 52 is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate 52 is an insulating material, the insulating material can be an organic insulator, an inorganic insulator, an oxycarbide insulator, or any combination thereof including multilayers. When the substrate 52 is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate 52 comprises a combination of an insulating material and a conductive material, the substrate may represent a first interconnect level of a multilayered interconnect structure. This particular embodiment is illustrated in FIG. 1. The materials for the dielectric material 54 and the conductive material 56 may be the same or different from those described herein below for ILD 104 and conductive material 102.

The ILD 104 of the interconnect structure 50 comprises any dielectric material having a dielectric constant of about 4.0 or less, with a dielectric constant of about 3.5 or less being more preferred including inorganic dielectrics or organic dielectrics. In yet some other embodiments, the ILD 104 has a dielectric constant of less than 3.0. All dielectric constants mentioned herein are relative to a vacuum, unless otherwise noted. The dielectric material may be porous, non-porous or contain regions and/or surfaces that are porous and other regions and/or surfaces that may be non-porous.

Some examples of suitable dielectrics that can be used as the ILD 104 include, but are not limited to: silsesquioxanes, C doped oxides (i.e., organosilicates) that include atoms of Si, C, O and H, thermosetting polyarylene ethers, or multilayers thereof.

The thickness of the ILD 104 may vary depending upon the dielectric material used as well as the exact number of dielectric layers within the ILD 104. Typically, and for normal interconnect structures, the ILD 104 has a thickness from about 50 to about 1000 nm.

The ILD 104 is formed utilizing any conventional deposition process including, but not limited to: plasma enhanced chemical vapor deposition (PECVD), chemical vapor deposition (CVD), evaporation, chemical solution deposition and spin-on coating.

After forming the ILD 104, lithography and etching (in either a single damascene or dual damascene process) are used to provide openings in the form of vias, lines or a combination thereof, into the ILD 104. So as not to obscure the invention, the details of forming the openings into the ILD 104 (which are well known to those skilled in the art) have been omitted.

A diffusion barrier (not shown) and a conductive material 102 are formed into each of the at least one openings formed into the ILD 104. The diffusion barrier comprises Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier may vary depending on the deposition process used as well as the material employed. Typically, the diffusion barrier has a thickness from about 4 to about 40 nm. The diffusion barrier, which is located between the conductive material 102 and the ILD 104 may be formed by any conventional deposition process including, for example, ALD, PEALD, CVD, PECVD, PVD, sputtering and plating.

The conductive material 102 includes, for example, a conductive metal, an alloy comprising at least one conductive metal, a conductive metal silicide or combinations thereof. Preferably, the conductive material 102 is a conductive metal such as Cu, W or Al, with Cu or a Cu alloy (such as AlCu) being highly preferred in the present invention.

The conductive material 102 is formed into each of the openings utilizing any conventional deposition process including, for example, CVD, PECVD, PVD, sputtering, plating, chemical solution deposition and electroless plating. After deposition of the conductive material 102, the structure is subjected to a planarization process such as, for example, chemical mechanical polishing (CMP) and/or grinding. The planarization process provides a planar structure such as is shown in FIG. 1 in which the upper surfaces of the ILD 104 and the conductive material 102 are substantially coplanar with each other.

Next, a dielectric cap 100, in accordance with the present invention, is formed on at least the upper surface of the conductive material 102; in the embodiment illustrated the dielectric cap 100 is also present on the upper surface of the IL) 104.

The inventive dielectric cap 100 comprises a multilayered dielectric material stack. In FIG. 1 reference numerals 108 and 110 represent two layers that are present within the multilayered dielectric material stack. Although the inventive dielectric cap 100 is illustrated as having two layers, the present invention is not limited to a dielectric cap having only two layers. In accordance with the present invention, the inventive dielectric cap 100 is a multilayered dielectric material stack having an effective dielectric constant (i.e., dielectric constant of all the dielectric materials present in the dielectric cap) of equal to, or less than, 4.5. More preferably, the inventive dielectric cap has an effective dielectric constant from about 2.0 to about 4.5, with an effective dielectric constant from about 3 to about 4 being even more preferred.

The inventive dielectric cap 100 can also be characterized as having a compressive stress of equal to, or greater than, 150 MPa, with an after UV cure compressive stress of equal, to or greater than, 100 MPa being even more preferred. Unlike conventional dielectric caps, the inventive dielectric cap will remain under a compressive stress even after post-deposition curing.

As stated above, the inventive dielectric cap 100 is a multilayered dielectric material stack including at least one layer of the multilayered dielectric stack includes Si—N bonding in which the N atoms of the Si—N bonding have free electrons. The at least one layer having the Si—N bonding mentioned above has a nitrogen content that is greater than about 15 atomic %, with a nitrogen content from 17 to about 25 atomic % being even more preferred. The film may also contain carbon and Si—C bonding as in the $SiCN_x$ bonding net-work.

The position of the at least one layer having the Si—N bonding mentioned above may vary within the multilayered dielectric material stack. Although the position of the at least one Si—N layer may vary, it is preferred to be in close proximity to an embedded conductive material (i.e., within 3 Å or less from the upper surface of the embedded conductive material). In FIG. 1, the at least one layer having the Si—N bonding in which the N atoms of the Si—N bonding have free electrons is represent by reference numeral 108. In the embodiment illustrated in FIG. 1, the at least one layer having the Si—N bonding directly abuts the upper surface of both the embedded conductive material 102 and the ILD 104. In FIG. 1, reference numeral 110 represents an overlayer (to be discussed in greater detail below) that can be present in the inventive structure.

In some embodiments of the present invention, the Si—N bonding within the inventive dielectric cap 100 is of a sufficient content to provide a high optical band gap (on the order of about 3.0 eV (electron-volts) or greater) layer which substantially blocks UV radiation during a post-deposition UV curing process. By "sufficient content" it is meant that the Si—N bonding is present within at least one layer of the inventive dielectric cap in an amount from about 15 to about 40 atomic %, with an amount from about 17 to about 30 atomic % being even more preferred.

The overlayer 110 mentioned above may be a layer that includes atoms of at least Si and C, optionally O, wherein the C atoms are present in an amount of about 15 atomic % of greater, preferably from about 20 to about 35 atomic %, to provide a layer within the multilayered dielectric material stack that improves the etch selectivity of the dielectric cap to the interlevel or intralevel dielectric.

A yet still further embodiment of the present invention, the inventive dielectric cap includes an oxygen diffusion barrier overlayer located atop a lower layer having the Si—N bonding mentioned above. This will act as an additional oxidation barrier and specific plasma etch selectivity where etching chemistry is more selective to Si—N bonding. In some embodiments, the oxygen diffusion barrier overlayer is formed by contacting the lower layer having the Si—N bonding with oxygen at an elevated temperature (greater than about 120° C.). In this embodiment, the layer including the Si—N bonding has a bonding matrix of Si—N, N—Si—C, or Si—N—C. When exposed to oxygen, the layer including one of the aforementioned bonding matrix forms an oxygen diffusion barrier surface layer that has one of the following bonding matrixes Si—N—O, N—Si—C—O or O—Si—N—C. Basically, the bottom oxidation barrier properties of the bottom layer can be improved by a brief oxidation to form an intermediate oxygen bearing interface prior to the deposition of higher carbon contained low-k top layer of the inventive dielectric cap.

It is emphasized that dielectric materials within the inventive dielectric cap may include any now known or later developed material capable of achieving the above-prescribed post-deposition compressive stress and Si—N bonding at interface with the conductive material.

In embodiments of the invention, the multilayer dielectric materials that can be used include two or more of the following: silicon nitride ($Si_xN_yH$), silicon carbon nitride ($SiC_x$-$N_yH$), boron nitride ($BN_xH$), silicon boron nitride ($SiBN_xH$), silicon boron nitride carbon ($SiB_xN_yC_zH$) and carbon boron nitride ($CB_xN_yH$), where x, y and, if present, z values for each compound may vary depending on what proportions are necessary to attain the optical band gap and with nitrogen.

In some embodiments of the present invention, the layers of dielectric cap 100 may include a carbon (C) constituent, however, this is not always necessary. In those embodiments that contain carbon, it may be in the range of about 1% to about 60% by atomic % of the material.

In one embodiment and as briefly discussed above, the at least one layer having the nitrogen atoms comprises one of a strong Si—N, N—Si—C and C—Si—N bonding matrix that prevents oxidation at an elevated temperature by forming an oxygen diffusion barrier 110 upon contact with oxygen ($O_2$) at the elevated temperature. In this case, oxygen diffusion barrier properties of layer 110 can also be improved by brief exposure of this top layer to an oxygen ambient at elevated temperature to form Si—N—O, N—Si—O—C or O—Si—N—C bonding where oxygen ($O_2$) constitutes about 1% to about 5 atomic % atomic of the oxygen diffusion barrier 110 composition. The elevated temperature may be greater than an integrated circuit (IC) chip maximum operating temperature in which the dielectric is used, e.g., greater than about 120° C. (+/−5° C.).

In another embodiment, the inventive dielectric cap comprises at least one dielectric layer having Si—N bonding structure that prevents oxidation at an elevated temperature by forming an oxygen diffusion barrier upon contact with oxygen ($O_2$) at the elevated temperature. Here again, oxygen diffusion barrier may include: Si—N—O, N—Si—O—C or O—Si—N—C. Also, the elevated temperature may greater than an integrated circuit (IC) chip maximum operating temperature in which the dielectric is used, e.g., greater than about 120° C. (+/−5° C.).

In another embodiment, the dielectric material including the Si—N bonding has a compressive stress of greater than about 100 MPa after exposure to ultraviolet (UV) radiation or E-beam radiation. In FIG. 1, reference numeral 120 is used for denoting the post-deposition curing process.

Dielectric cap 100 may be formed using any now known or later developed techniques to achieve the above-prescribed multilayered dielectric material stack. In embodiments of the invention, a method of forming dielectric cap 100 may be provided. An ILD 104 is provided in any now known or later developed manner, e.g., deposition. As mentioned above, ILD 104 may include any now known or later developed ultra low dielectric constant (ULK) material such as porous hydrogenated silicon oxycarbide (pSiCOH) and spin on p-SiCOH or organic low k dielectric.

Figure 2:
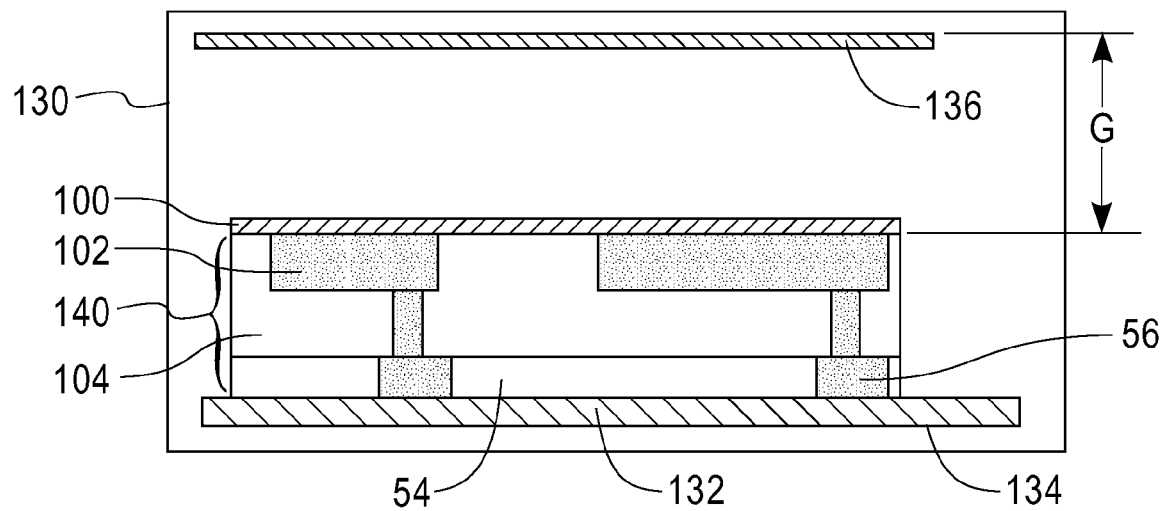
FIG. 2 is a pictorial representation (through a cross sectional view) depicting an apparatus that can be employed in the present invention for forming the inventive dielectric cap.

The particular processing (i.e., chemical vapor deposition, plasma enhanced chemical vapor deposition, spin-on coating and etc.) used to form the inventive dielectric cap 100 may vary depending on the material used. Reference is made to FIG. 2 which illustrates one such process that can be used in the present invention. In particular, FIG. 2 illustrates a parallel plate plasma enhanced chemical vapor deposition (PECVD) reactor 130 which can be used in the present invention in forming the inventive dielectric cap 100. Parallel plate reactor 130 has a conductive area 132 of a substrate chuck 134 (i.e., lower electrode) between about 85 $cm^2$ and about 750 $cm^2$, and a gap G between substrate 140 (i.e., an interconnect structure as shown in FIG. 1 without the dielectric cap 100) and a top electrode 142 between about 1 cm and about 12 cm. When conductive area 132 of substrate chuck 134 is changed by a factor of X, the RF power applied to substrate chuck 134 is also changed by a factor of X.

The precursors which are introduced into the reactor in forming the dielectric cap 100 may include: a) a silicon-based precursor selected from the group consisting of: i) a carbosilane, ii) a silane, iii) a disilane and iii) a nitrogen containing silicon precursor comprising atoms of silicon (Si), nitrogen (N) and hydrogen (H); and b) a nitrogen containing precursor. Either precursor a) or precursor b) may be diluted within an inert carrier selected from the group consisting of: helium (He) and argon (Ar). Alternatively, carbo aminosilane group materials, either in gas or liquid phase, may also be employed as the silicon-based precursor.

One illustrative nitrogen-containing precursor includes ammonia ($NH_3$); however, others exist such as nitrogen triflouride ($NF_3$).

Typical precursors a) are:

| | |
|---|---|
| Methylsilane, | $CH_3-SiH_3$, |
| Dimethylsilane, | $(CH_3)_2-SiH_2$, |
| Trimethylsilane (TMS), | $(CH_3)_3-SiH$, |
| Tetramethylsilane, | $(CH_3)_4-Si$, |
| Ethylsilane, | $CH_3-CH_2-SiH_3$, |
| Disilanomethane, | $SiH_3-CH_2-SiH_3$, |
| Bis(methylsilano)methane, | $CH_3-SiH_2-CH_2-SiH_2-CH_3$, |
| 1,2-disilanoethane, | $SiH_3-CH_2-CH_2-SiH_3$, |
| 1,2-bis(methylsilano)ethane, | $CH_3-SiH_2-CH_2-CH_2-SiH_2-CH_3$, |
| 2,2-disilanopropane, | $SiH_3-C(CH_3)_2-SiH_3$, |
| Diethyl Silane Dimethylsilacyclobutane, | $(CH_3-CH_2)_2-SiH_2$ |
| DiethylDimethylsilane, | $(C_2H_5)_2Si-(CH_3)_2$, |
| Diethylmethylsilane, | $(C_2H_5)_2SiH(CH_3)$, |
| Propylsilane, | $C_3H_7SiH_3$, |
| Vinylmethylsilane, | $(CH_2=CH)(CH_3)SiH_2$, |
| Divinyldimethylsilane Dimethylsilacyclopentane | $(CH_2=CH)_2(CH_3)_2Si$, |
| 1,1,2,2-tetramethyldisilane, | $HSi(CH_3)_2-Si(CH_3)_2H$, |
| Hexamethyldisilane, | $(CH_3)_3Si-Si(CH_3)_3$, |
| 1,1,2,2,3,3-hexamethyltrisilane, | $H(CH_3)_2Si-Si(CH_3)_2-SiH(CH_3)_2$, |
| 1,1,2,3,3-pentamethyltrisilane, | $H(CH_3)_2Si-SiH(CH_3)-SiH(CH_3)_2$, |
| Dimethyldisilanoethane, | $CH_3-SiH_2-(CH_2)_2-SiH_2-CH_3$, |
| Dimethyldisilanopropane, | $CH_3-SiH_2-(CH_2)_3-SiH_2-CH_3$, |
| Tetramethyldisilanoethane, | $(CH)_2-SiH-(CH_2)_2-SiH-(CH)_2$, |
| Tetramethyldisilanopropane, | $(CH_3)_2-SiH-(CH_2)_3-SiH-(CH_3)_2$, |
| Hexamethyl Disilazane, Divinyl tetramethyl Disilazane, | |

A first radio frequency (RF) power is applied to one of electrodes 134, 142 at a frequency between about 0.45 MHz and about 200 MHz. First RF power density may be, for example, set at between about 0.1 $W/cm^2$ and about 5.0 $W/cm^2$, and between about 50 W and about 1000 W. Optionally, a second RF power of a lower frequency than the first RF power may be applied to one of electrodes 134, 142, e.g., and with a power of between about 20 W and about 600 W.

In one embodiment, a substrate temperature may be set at between about 100° C. and about 425° C. An inert carrier gas, e.g., helium (He) or argon (Ar), flow rate may be set at between about 10 standard cubic centimeters (sccm) to about 5000 sccm. Reactor 130 pressure may be set between about 100 mTorr and about 10,000 mTorr. The multilayer film deposition may be deposited by varying the process precursor and composition.

It is observed that the above-illustrated conditions for the PECVD process are exemplary and as such, other conditions for PECVD and other related depositions can be used in the present invention to form the inventive dielectric cap 100.

The deposited dielectric cap is optionally, but not necessarily always subjected to a curing step that is performed in a non-oxidizing ambient. By "curing" it is meant that the deposited dielectric cap 110 is exposed to UV/E-beam or thermal cure at thermal ambient of 400° C. or less.

In one embodiment, the post-deposition curing includes heat treatment at a temperature, in at least one of the heating cycles, of not less than 300° C., preferably at a temperature from about 300° to about 420° C., for a time period of at least about 0.10 hour. By "non-oxidizing ambient" it is meant an atmosphere in which the oxygen content is less than 20 ppm, preferably less than 10 ppm. It is noted that curing can occur in the same reactor chamber as used in depositing the inventive dielectric cap or curing may be performed in a separate reactor chamber. This thermal treatment step, i.e., curing, may include a rapid thermal anneal, a furnace anneal, a laser anneal or a spike anneal.

In some embodiments of the present invention, the curing is performed in an oxygen free atmosphere such as, for example an inert gas (e.g., He, Ar or mixtures thereof).

In yet other embodiments of the present invention, the curing step may be performed at a single temperature. In some further embodiments of the present invention, the curing step may occur at two or more different temperatures. For example, the present invention contemplates an embodiment in which curing is performed at a temperature not higher than 300° C. for a first period of time and then at a second temperature not lower than 400° C. for a second period of time, the second period of time being longer than the first period of time. In some embodiments, the second period of time may be at least 10 times greater than the first period of time.

Preferably, the as deposited dielectric cap 100 is subjected to a high-energy post deposition processing step for shorter curing time. Specifically, the as deposited dielectric cap 100 of the present invention can be processed using a high energy source. Suitable energy sources that can be used for the post processing step include chemical, ultraviolet (UV) light, electron beam (E-beam), microwave, and plasma; note that the thermal curing step mentioned above is also an example of a high energy source that can be used in the present invention. Combinations of the aforementioned energy sources can also be used in the present invention with a shorter curing time of less than or equal to 5 minutes, in which the shorter UV processing time 30 sec to 1 minute is preferred for a typical 20-50 nm cap film. The post treatment by thermal or high energy UV/E-Beam cure drives up any loosely hydrocarbon that incorporates in the film structure during plasma deposition with the carbon-rich precursor source. This treatment will generate a small amount of nanoporosity in the cap film.

The UV light treatment step is performed utilizing a source that can generate light having a wavelength from about 500 to about 150 nm, to irradiate the substrate while the wafer temperature is maintained at a temperature from about 25° to about 500° C., with temperatures from about 300° to about 420° C. being preferred. Radiation with less than 370 nm is of insufficient energy to dissociate or activate important bonds, so the wavelength range 150-370 nm is a preferred range. Using literature data and absorbance spectra measured on as deposited films, the inventors have found that less than 170 nm radiation may not be favored due to degradation of the SiCOH film. Further, the energy range 310-370 nm is less useful than the range 150-310 nm, due to the relatively low energy per photon from 310-370 nm. Within the 150-310 nm range, optimum overlap with the absorbance spectrum of the as deposited film and minimum degradation of the film properties may be optionally used to select a most effective region of the UV spectrum for changing the properties of the dielectric cap.

The electron beam treatment step is performed utilizing a source that is capable of generating a uniform electron flux over the wafer, with energies from about 0.5 to about 25 keV and current densities from about 0.1 to about 100 microAmp/$cm^2$ (preferably about 1 to about 5 microAmp/$cm^2$), while the wafer temperature is maintained at a temperature from about 25° to about 500° C., with temperatures from about 300° to about 450° C. being preferred. The preferred dose of electrons used in the electron beam treatment step is from about 50 to about 500 microcoulombs/$cm^2$, with about 100 to about 300 microcoulombs/$cm^2$ being most preferred.

It is noted that after the above post deposition treatment step has been performed, the inventive cap maintains a compressive stress The inventive dielectric cap has a lower dielectric constant and higher mechanical and electrical stability to post-deposition curing treatment energies (such as UV and/or E-Beam radiation) than presently employed dielectric cap materials. Moreover, the dielectric cap of the invention provides good oxidation resistance, Cu diffusion and/or substantially high mechanical stability under UV and/or E-beam radiation during a post-deposition curing process.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
   at least one interlevel or intralevel dielectric material having an embedded conductive material located therein, said embedded conductive material having an upper surface that is substantially coplanar with an upper surface of said at least one interlevel or intralevel dielectric material; and
   a dielectric cap located on at least said upper surface of said embedded conductive material, said dielectric cap comprising a multilayered dielectric material stack having an effective dielectric constant of equal to, or less than, 4.5 and a compressive stress of equal to, or greater than, 100 MPa which remains compressive even after post-deposition curing, wherein at least one layer of said multilayered dielectric stack includes Si—N bonding near the interface of the embedded conductive material.

2. The interconnect structure of claim 1 wherein the dielectric cap is a cured material.

3. The interconnect structure of claim 2 wherein the Si—N bonding within the dielectric cap is of a sufficient content to provide a layer having an optical band gap on the order of about 3.0 eV which substantially blocks UV radiation during a post deposition UV curing process.

4. The interconnect structure of claim 2 wherein said multilayered dielectric material stack further comprises an overlayer which includes atoms of at least Si and C, wherein said C atoms are present in an amount of about 15 atomic % or greater to provide improved etch selective to the interlevel or intralevel dielectric material.

5. The interconnect structure of claim 2 wherein said multilayered dielectric material stack further comprises an oxygen diffusion barrier overlayer, said oxygen diffusion barrier overlayer having a bonding matrix selected from the group consisting of Si—N—O, N—Si—C—O and O—Si—N—C.

6. The interconnect structure of claim 2 wherein the embedded conductive material comprises Cu, a Cu alloy, Al or an Al alloy.

7. A method of forming an interconnect structure comprising:
   providing a structure including at least one interlevel or intralevel dielectric material having an embedded conductive material located therein, said embedded conductive material having an upper surface that is substantially coplanar with an upper surface of said at least one interlevel or intralevel dielectric material; and
   forming dielectric cap located on at least said upper surface of said embedded conductive material, said dielectric cap comprising a multilayered dielectric material stack having an effective dielectric constant of equal to, or less than, 4.5 and a compressive stress of equal to, or greater than, 100 MPa which remains compressive even after post deposition curing, wherein at least one layer of said multilayered dielectric stack includes Si—N bonding at the interface of the embedded conductive material.

8. The method of claim 7 wherein said forming of the dielectric cap includes introducing at least a silicon-based precursor and a nitrogen-containing precursor into a reactor chamber including said structure and depositing said dielectric cap on at least the upper surface of said embedded conductive material from said silicon-based precursor and said nitrogen-containing precursor.

9. The method of claim 8 further comprising a post-deposition curing step selected from heat, UV exposure, E-beam exposure and combinations thereof.

10. The method of claim 8 wherein said silicon-based precursor is selected from the group consisting of: a carbosilane, a silane, a disilane, a nitrogen containing silicon precursor comprising atoms of silicon (Si), nitrogen (N) and hydrogen (H), and carbo aminosilane.

* * * * *